(12) United States Patent
Brückmann et al.

(10) Patent No.: US 7,646,827 B2
(45) Date of Patent: Jan. 12, 2010

(54) DEMODULATION OF A DIGITALLY FREQUENCY-MODULATED ANALOG RECEIVED SIGNAL BY EVALUATION OF THE TIME INTERVALS BETWEEN THE ZERO CROSSINGS

(75) Inventors: Dieter Brückmann, Meerbusch (DE); André Neubauer, Krefeld (DE)

(73) Assignee: Infineon Technologies AG, Neubiberg (DE)

( * ) Notice: Subject to any disclaimer, the term of this patent is extended or adjusted under 35 U.S.C. 154(b) by 834 days.

(21) Appl. No.: 10/956,767

(22) Filed: Oct. 1, 2004

(65) Prior Publication Data
US 2005/0058225 A1    Mar. 17, 2005

Related U.S. Application Data

(63) Continuation of application No. PCT/DE03/00731, filed on Mar. 6, 2003.

(30) Foreign Application Priority Data
Apr. 2, 2002    (DE)    ................................ 102 14 581

(51) Int. Cl.
*H03M 1/06*    (2006.01)
(52) U.S. Cl. ........................ 375/316; 375/334
(58) Field of Classification Search ................ 375/316, 375/334, 335
See application file for complete search history.

(56) References Cited

U.S. PATENT DOCUMENTS

| | | | | |
|---|---|---|---|---|
| 3,614,639 A | | 10/1971 | Belman | 329/104 |
| 4,357,634 A | * | 11/1982 | Chung | 360/40 |
| 5,103,463 A | | 4/1992 | Schoeneberg | 375/51 |
| 5,355,092 A | | 10/1994 | Kosaka et al. | 329/304 |
| 5,617,374 A | * | 4/1997 | Ohmi et al. | 368/10 |
| 6,265,948 B1 | * | 7/2001 | Stevenson | 332/101 |
| 6,617,917 B2 | * | 9/2003 | Yang et al. | 329/300 |
| 7,116,964 B2 | | 10/2006 | Mehrgardt et al. | |
| 2002/0154685 A1 | * | 10/2002 | Olafsson | 375/222 |

FOREIGN PATENT DOCUMENTS

| | | |
|---|---|---|
| DE | 4210265 | 2/1994 |
| DE | 10103479 | 8/2002 |
| EP | 0 529 986 A2 | 8/1992 |
| EP | 1051004 A2 * | 11/2000 |

OTHER PUBLICATIONS

K.D. Kammeyer et al.; "Nachrichtenübertragung"; B. G. Tuebner Verlag, Stuttgart, Section 11.2.1, p. 385, 1996.

* cited by examiner

*Primary Examiner*—Kevin M Burd
(74) *Attorney, Agent, or Firm*—Dicke, Billig & Czaja, PLLC

(57) ABSTRACT

A detector (1) for zero crossings and a counter (2) which is connected to it are used to determine the time intervals between the zero crossings of the received signal or of an intermediate-frequency signal which is produced from the received signal, and for detection of the digital signal data. In this case, a sequence of determined zero crossing intervals can be stored in digital form in a shift register chain (3), and can be compared in a classification device (4) with previously stored interval sequences. Furthermore, a frequency offset can be determined by averaging the zero crossing intervals and can be compensated for by suitable selection or modification of the previously stored interval sequences, in which case the latter can also be used during the synchronization phase. The synchronization process may, furthermore, be assisted by payload data identification.

3 Claims, 3 Drawing Sheets

DEMODULATION OF A DIGITALLY FREQUENCY-MODULATED ANALOG RECEIVED SIGNAL BY EVALUATION OF THE TIME INTERVALS BETWEEN THE ZERO CROSSINGS

CROSS REFERENCE TO RELATED APPLICATION

This application is a continuation of copending International Application No. PCT/DE03/00731 filed Mar. 6, 2003 which designates the United States, and claims priority to German application no. 102 14 581.4 filed Apr. 2, 2002.

TECHNICAL FIELD OF THE INVENTION

The present invention generally relates to a method for demodulation of a digitally frequency-modulated analog received signal in a cordless communications system such as Bluetooth, DECT, WDCT and the like, and to an apparatus for carrying out this method.

DESCRIPTION OF RELATED ART AND A BACKGROUND OF THE INVENTION

Cordless digital communications systems such as DECT, WDCT, Bluetooth, SWAP, WLAN IEEE802.11 require suitable receivers for wire-free reception of the radio-frequency signals which are transmitted via the air interface, which receivers produce a baseband signal with as little distortion as possible for the demodulator in a simple manner. In addition to high sensitivity, a high degree of integration, low costs, low power consumption as well as flexibility with regard to applicability to different digital communications systems are desirable in this case.

In present-day receiver designs for digitally frequency-modulated signals, traditional signal processing methods are used for demodulation and for signal detection. One method that is frequently used is based on the so-called limiter discriminator FM demodulator, in which the frequency-modulated signal is demodulated, for example by means of an analog coincidence demodulator with appropriate detection, after hard limiting of the generally complex bandpass signal.

Furthermore, there are receiver concepts in which the intermediate-frequency signal is converted to the digital domain with the aid of an A/D converter, and the signal detection is carried out using digital signal processing methods. Such a method is described, by way of example, in DE 101 03 479.2. In comparison to the analog receiver design, a method such as this admittedly makes it possible to achieve qualitative signal detection improvements. However, this approach has the disadvantage that a complex A/D converter is required.

SUMMARY OF THE INVENTION

In consequence, the object of the present invention is to specify an improved demodulation method for digitally frequency-modulated received signals in a cordless communications system, by means of which high performance can be achieved with a low level of implementation complexity at the same time.

This object can be achieved by a method for demodulation of a digitally frequency-modulated analog received signal in a cordless communications system, comprising the steps of:
determining time intervals between the zero crossings of the received signal or of an intermediate-frequency signal which is produced from the received signal, and
using the time intervals for detection of the digital signal data,
associating the zero crossing intervals obtained with binary values or sequences of binary values as digital signal data, and
providing the digital frequency modulation of the received signal with N stages, wherein N>2, and
associating the zero crossing intervals obtained each with one of a number N of different frequencies.

A counter may count pulses which are supplied to it at a predetermined frequency, a reset pulse can be supplied to the counter on each zero crossing, and before the counter is reset, the count that has been reached can be emitted and be converted to a signal which represents the interval between the preceding zero crossings. A single time interval between successive zero crossings can be determined in one data period, from which the digital signal data item for that data period is detected. Two or more time intervals between successive zero crossings can be determined, and one or more digital signal data items can be detected from them. The determined interval sequence can be compared with a set of stored interval sequences, stored interval sequence which is at the shortest distance from the detected distance sequence can be determined, and the digital signal data which is associated with this stored interval sequence can be detected. The distance between the determined interval sequence $x_1 \ldots x_N$ and the stored interval sequences $y_1 \ldots y_N$ can be determined using the relationship $$d(x, y) = \sqrt[g]{\sum_{n=1}^{N} |x_n - y_n|^g}$$

where $1 \leq g < \infty$. Such a method can further be implemented in a demodulation method used in a method for reception and for processing of a digitally frequency-modulated analog received signal.

The object can also be achieved by a method for reception and for processing of a digitally frequency-modulated analog received signal in a cordless communications system, comprising the steps of:
determining time intervals between the zero crossings of the received signal or of an intermediate-frequency signal that is produced from the received signal are, and
using the time intervals for detection of the digital signal data, wherein any frequency offset which may be present in the received signal is determined before the start of the demodulation process by the steps of:
determining a mean value of a number of determined zero crossing intervals in the received signal,
comparing the mean value with an expected mean value of the received signal, and
determining the frequency offset from the difference between the mean value and the expected mean value.

The method may include a method step of synchronization of the receiver with a time slot structure of the received signal, with the frequency offset being determined before the synchronization method step. The determined frequency offset can be supplied to a comparator unit in which a number, which corresponds to the number of different frequency offsets, of synchronization code sequences which are associated with the frequency offsets are stored, and one synchronization code sequence can be selected on the basis of the supplied frequency offset, and two or more successive zero crossing intervals of the received signal can be stored continuously in a memory unit and can be compared in the comparator unit with the selected synchronization code sequence, until a match is found between a determined interval sequence and an interval sequence which corresponds to the synchronization code sequence.

The object can furthermore be achieved by a method for demodulation of a digitally frequency-modulated analog received signal in a cordless communications system, comprising the steps of:

determining time intervals between the zero crossings in the received signal or an intermediate-frequency signal which is produced from the received signal, using the time intervals for detection of the digital signal data, using a mean value and/or scatter of the determined zero crossing intervals to determine whether the received signal contains payload data, or represents an interference signal.

The method may determine whether the mean value of the zero crossing intervals is within a predetermined range, and/or whether the majority of the individual values of the zero crossing intervals are within a predetermined range.

The principle according to the invention will first of all be explained in more detail with reference to FIG. 1.

FIG. 1 corresponds to FIG. 11.2.3 on page 385 of the book "Nachrichtenübertrangung" [message transmission] by K. D. Kammeyer, B. G. Teubner Verlag, Stuttgart, 1996, Section 11.2.1, and, in the lower part of the figure, shows a frequency-modulated carrier oscillation, while the upper part of the figure shows the unmodulated carrier oscillation. In this example, the modulation type is two-step discrete frequency modulation (FSK, Frequency Shift Keying), that is to say frequency keying between two defined frequencies on the basis of a two-step data signal. Four data signal periods are shown with a data sequence d=[1 −1 1 1], with each data period having a period duration T. In the present case, the carrier frequency is $f_0=2.5/T$ and the modulation index is $\eta=1$. The oscillation phase is continuous (CPFSK, Continuous Phase FSK). If the data signal changes at the transitions between the data periods, then a sudden discrete frequency change takes place. In most cases, the modulation is band-limited, so that the sudden frequency changes do not take place with a square waveform, but extended over time. One example of this is Gaussian minimum shift keying (GMSK) which, for example, is used in the pan-European mobile radio standard GSM (Global System for Mobile Communications). The frequency of the unmodulated carrier oscillation (upper part of the figure) is between the discrete frequencies which correspond to the data signals.

The principle according to the invention is based on the idea that data periods which represent different data signals have different time intervals between the zero crossings. In the present example shown in FIG. 1, the data periods which contain the data signal 1 have six zero crossings, while data periods which contain the data signal −1 contain four zero crossings. This means that the time intervals between the zero crossings are different between data signals which differ from one another. The time intervals between the zero crossings can thus be determined for demodulation purposes, and can be used for detection of the digital signal data. In principle, this can be carried out directly on the received signal. However, it is just as possible to carry out this method on an intermediate-frequency signal which has been produced from the received signal. In one practical exemplary embodiment, this may be an intermediate-frequency signal which is emitted from a limiter and which, in consequence, is now referred to only as a limiter output signal.

The signal in which the time intervals between the zero crossings are intended to be determined can be supplied to a detector for zero crossings, in which it is converted to a square wave signal, whose zero crossings are determined. The time interval between the zero crossings in the square-wave signal is used for signal detection. The detector for zero crossings can be connected to a counter which counts pulses that are supplied to it at a predetermined clock frequency $f_0$. A reset pulse is supplied to the counter on each zero crossing, with the count that has been reached being emitted before the counter is reset, and being converted to a signal which represents the interval between the previous zero crossings.

The invention is not restricted to 2-step digital frequency modulation, as is illustrated by way of example in FIG. 1. In fact, it can just as well also be applied to multistep digital frequency modulation, in which two or more bits of the original digitized signal to be transmitted are in each case mapped onto a data signal. By way of example, the frequency modulation may have 4 steps (4-FSK), with 2 bits of the incoming bit data stream being mapped onto a data signal, or it may have 8 steps (8-FSK), with 3 bits of the incoming bit data stream being mapped onto a data signal. In the case of these multistep frequency modulation methods, a number of different zero crossing intervals corresponding to the number of frequencies are obtained when using the method according to the invention. The method and the apparatus for carrying it out must be able to correctly detect the zero crossing intervals, and to associate them with the correct frequency and thus with the correct data signal.

In principle, it is possible to determine each of the data signals and thus the transmitted bits from only one measured zero crossing interval in the data signal period T by comparing the values of the zero crossing interval with a reference value (in the case of 2-FSK) at the same interval as the data signal period. If the zero crossing interval is greater than the reference value, that is to say a transmission has taken place at the low frequency in the relevant time interval, it is shorter than that which would be transmitted corresponding to the higher frequency. In the case of 2-step FSK modulated signals, these frequencies correspond to the bits 1 and 0, or to the data signals 1 and −1. If only one value of the zero crossing interval is used in each data signal period, then, although the demodulation method can be implemented very easily, it is, however, relatively sensitive to interference, for example to white noise, which is always superimposed on the payload signal in an actual system.

The method is far more robust to interference such as this when two or more successive zero crossings are used for detection. These zero crossings may, for example, be stored in a shift register chain. The influence of one bit on the transmission frequency is distributed over two or more bit periods, particularly in the case of filtered frequency-modulated received signals (for example GMSK, Gaussian Minimum Shift Keying). In a corresponding manner, it is worthwhile using all of the zero crossings in this longer time interval in order to identify the associated bit. Two or more successive zero crossing intervals can thus be determined over two or more data signal periods, and the corresponding data signals can be detected from them.

Furthermore, an interval sequence determined in this way can be compared with a set of stored interval sequences, and it is possible to determine that stored interval sequence which is at the shortest distance from the detected interval sequence. The data signals which correspond to this stored interval sequence can then be emitted.

The distance between the determined interval sequence $x_1 \ldots x_N$ and the stored interval sequences $y_1 \ldots y_N$ may be determined using the relationship $$d(x, y) = \sqrt[g]{\sum_{n=1}^{N} |x_n - y_n|^g}$$

where $1 \leq g < \infty$.

The demodulation method according to the invention is part of a method for reception and processing of a digitally frequency-modulated analog received signal. This reception and processing method may in a further embodiment be improved in order to improve the quality and performance of the demodulation method, by reducing the sensitivity of the receiving system to frequency offsets. A frequency offset such as this may occur, for example, between a mixing frequency which is used in the transmitter for up-mixing to a carrier frequency and the mixing frequency which is used for down-mixing in the receiver, or may be present between them from the start. Initially identical intermediate frequencies in the transmitter and receiver can result in a frequency offset as a result of one or both of the intermediate frequencies drifting. The Standards for cordless communications systems such as DECT, WDCT, Bluetooth etc. all allow frequency offsets within a certain tolerance band. According to the Bluetooth Specifications, these frequency offsets may, for example, vary within a range of ±75 kHz. Simulation investigations have shown that, unless suitable countermeasures are taken in the demodulation method as described above, these frequency offsets may result in a sensitivity loss of up to 6 dB. It is thus desirable to specify a suitable method for identification of any frequency offsets and appropriate offset compensation. In a further embodiment, any frequency offset which may be present in the received signal is determined before the start of the demodulation process, in that a mean value of a number of determined zero crossing intervals in the received signal is determined and is compared with an expected mean value of the non-frequency-shifted received signal (or of the intermediate-frequency signal), and the frequency offset is then determined from the difference between the mean values. This embodiment of the method can also be used for identification of and compensation for frequency offsets in intermediate-frequency signals which, as mentioned above, may occur between the transmitter and the receiver. For example, the frequency offset may be compensated for by storing in advance not just one individual set of interval sequences but two or more sets of interval sequences and by selecting a specific set of interval sequences, with which the determined interval sequences can be compared, as a function of the determined frequency offset. This is thus a type of discrete compensation, in which the tolerance range of the frequency offsets is subdivided into intervals in advance, and one stored set of interval sequences is associated with each interval. As an alternative to this, however, continuous compensation for the frequency offset is just as feasible, in which, by way of example, a single set of stored interval sequences is modified on the basis of the determined frequency offset.

When multiple access is possible in the transmitting and receiving system entirely or partially on the basis of a time-division multiplexing method (TDMA, Time Division Multiple Access), then the reception and processing method generally has a method step for synchronization of the receiver with a time slot structure in the received signal. In this case, it is advantageous for the process of determining the frequency offset as described above to be carried out before the method step of synchronization. For this purpose, the determined frequency offset may be supplied to a comparator unit, in which a number which corresponds to the number of different frequency offsets, of synchronization code sequences which are associated with the frequency offsets are stored, and one synchronization code sequence is selected on the basis of the supplied frequency offset. The actual method step of synchronization then comprises two or more successive zero crossing intervals of the received signal being stored continuously in a memory unit and being compared in the comparator unit with the selected synchronization code sequence, until a match is found between a determined interval sequence and an interval sequence which corresponds to the synchronization code sequence. Once this has been done, the synchronization process has been successfully completed, and a sampling time can be defined.

A further embodiment of the method according to the invention relates to the fact that synchronization must be possible over the entire time frame when using a time-division multiplexing method when the system is in the unsynchronized state. If the synchronization unit is active over the entire time frame, then it is relatively frequently possible for synchronization to take place with respect to a noise signal at the input. It is thus desirable to identify when payload signals are present, and when only interference signals are present at the input. The further embodiment uses the mean value and/or the scatter in the determined zero crossing intervals to determine whether the received signal contains payload data or represents an interference signal. Specifically, when an FSK-modulated, in particular GMSK-modulated, payload signal is applied to the receiver input, then the intervals between the zero crossings vary within a specific range. This is also true when the signal is noisy. However, if a pure interference signal is present at the input of the receiver, that is to say, for example, in the form of white noise, then the intervals between the zero crossings are scattered over a far greater range. It is thus possible to use the extreme values for the intervals between the zero crossings to distinguish between a payload signal and a noise signal. As described, the mean value can be evaluated over the previous intervals between the zero crossings as a further indicator of payload data. In particular, it is possible to determine whether the mean value of the zero crossing intervals is within a predetermined range, and/or whether the majority of the individual values of the zero crossing intervals are within a predetermined range. In the latter case, it would be necessary not only to predetermine the value range, but also a quantitative condition for the predominant majority within this predetermined range.

The embodiments of the method according to the invention which have been described above may be combined with one another in any desired manner. In particular, a mean value of zero crossing intervals which has been determined during the determination of any frequency offset can equally be used in a practical manner for the payload data identification process described above.

Likewise, during the method step of synchronization, a reset signal can be supplied to the memory unit, which is used in the synchronization unit, for continuous storage of two or more successive zero crossing intervals in the received signal, if it is found that the received signal represents an interference signal.

An apparatus according to the invention for demodulation of a digital frequency-modulated analog received signal in a cordless communications system has, in its most general form, a detector for zero crossings and a device, which is connected to this detector, for determination of the time intervals between the zero crossings.

The device for determination of the zero crossing intervals may comprise a counter which has a clock pulse input and a reset pulse input as well as an output, with a clock pulse transmitter being connected to the clock pulse input, and with the detector for zero crossings being connected to the reset pulse input.

The device for determination of the zero crossing intervals may be connected to a shift register for storage of a sequence of zero crossing intervals in digital form. The shift register may be connected to a classification device, which has a memory device for storage of a set of interval sequences, and a distance calculation device for calculation of the distance between the determined interval sequence and the stored interval sequences. The distance calculation device may be designed or programmed such that it determines the distance between the determined interval sequence $x_1 \ldots x_N$ and the stored interval sequences $y_1 \ldots y_N$ using the relationship which has already been mentioned above.

The apparatus according to the invention may be part of an apparatus for receiving and for processing a digitally frequency-modulated analog received signal.

This more comprehensive apparatus may, furthermore, have a frequency offset identification unit to which the determined zero crossing intervals can be supplied, and which is designed for averaging over a predetermined number of zero crossing intervals and for comparison of the mean value that is formed with an expected mean value, and for frequency offset identification based on this.

Furthermore, the frequency offset identification unit may be designed for selection of one set from two or more sets of stored interval sequences on the basis of the determined frequency offset. As has already been described above, two or more sets of interval sequences may be stored in advance for the purpose of discrete frequency offset compensation, and may be associated with predetermined intervals of the frequency offset. However, if continuous compensation is desired for the frequency offset, then, as an alternative to this, the frequency offset identification and compensation unit can just as well be designed for modification of the one set of stored interval sequences.

The receiving and processing apparatus for a digitally frequency-modulated analog received signal may, furthermore, have a synchronization unit for synchronization of the receiver to a time slot structure in the received signal, when using a time-division multiplexing method.

In this case, the synchronization unit may have a memory unit for continuous storage of two or more successive zero crossing intervals in the received signal, and may have a comparator unit which is connected to the frequency offset identification unit and in which a number which corresponds to the number of different frequency offsets, of synchronization code sequences which are associated with the respective frequency offsets are stored, with the comparator unit being designed for selection of a synchronization code sequence which corresponds to the supplied frequency offset and for finding the match between this synchronization code sequence and an interval sequence which is stored in the memory unit.

Furthermore, the receiving apparatus may have a payload data identification unit which is designed to use the mean value and/or the scatter of the determined zero crossing intervals to determine whether the received signal contains payload data or represents an interference signal.

The payload data identification unit mentioned above may be connected to the frequency offset identification unit, and the frequency offset identification unit may be designed for transmission of a mean value, which has been determined by it, of the zero crossing intervals to the payload data identification unit.

The payload data identification unit may, furthermore, be connected to the memory unit which is contained in the synchronization unit, and may be designed to emit a reset signal to the memory unit when it finds that the received signal represents an interference signal.

BRIEF DESCRIPTION OF THE DRAWINGS

The present invention will be explained in more detail in the following text with reference to the drawing figures, in which.

DETAILED DESCRIPTION OF EMBODIMENTS

Figure 1:
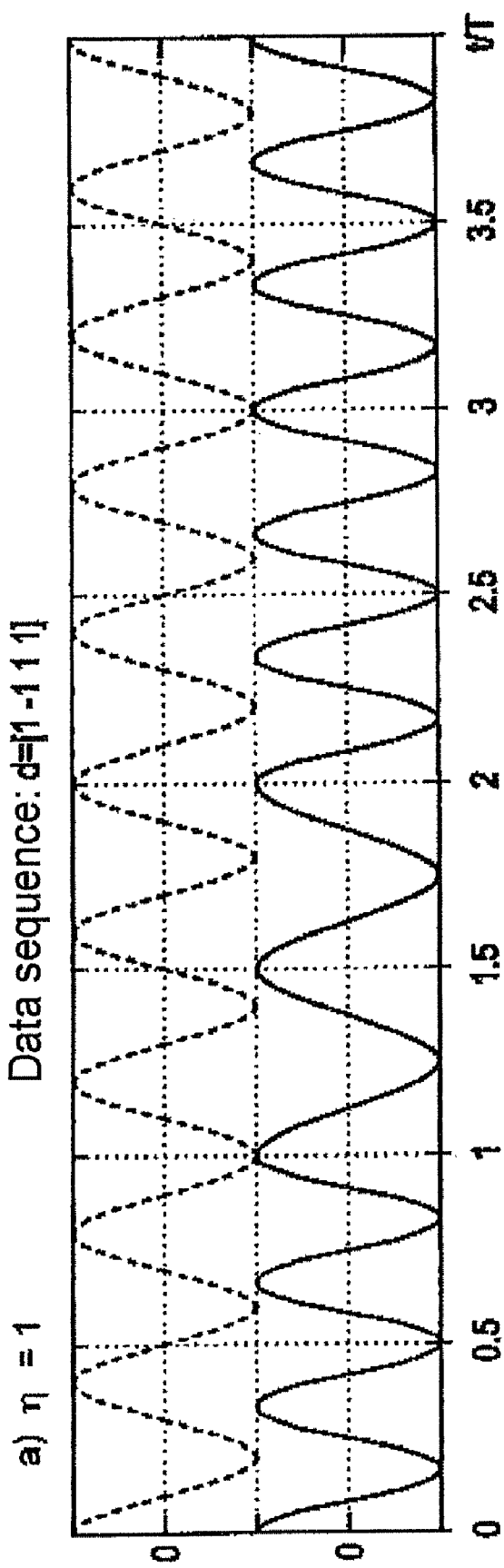
FIG. 1 shows a digitally frequency-modulated carrier oscillation (lower part of the figure) together with an unmodulated carrier oscillation (upper part of the figure)
Figure 2A:
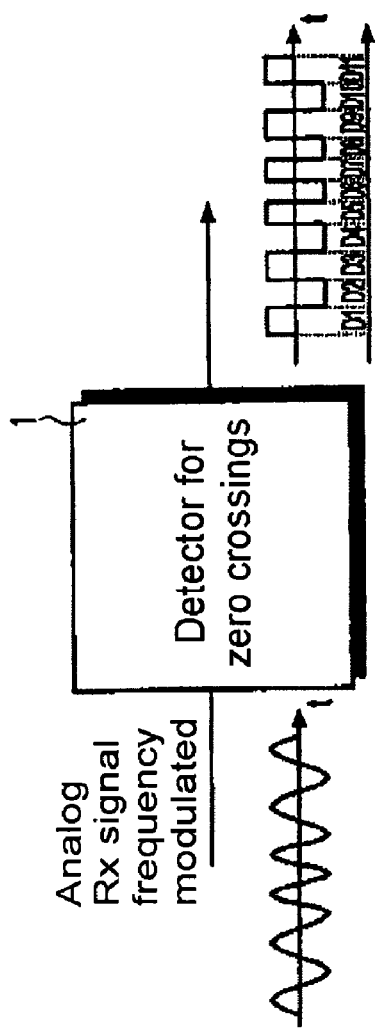
FIG. 2A shows the method of operation of a detector for zero crossings.

The principle of the method for demodulation of frequency-modulated signals has already been indicated in FIG. 2A. The analog received signal, which is in the intermediate-frequency range, is converted by means of the zero crossing detector 1 to a square-wave signal, whose zero crossings can be evaluated. The time interval $D_i$ between the zero crossings in the square-wave signal can be used for signal detection.

Figure 2B:
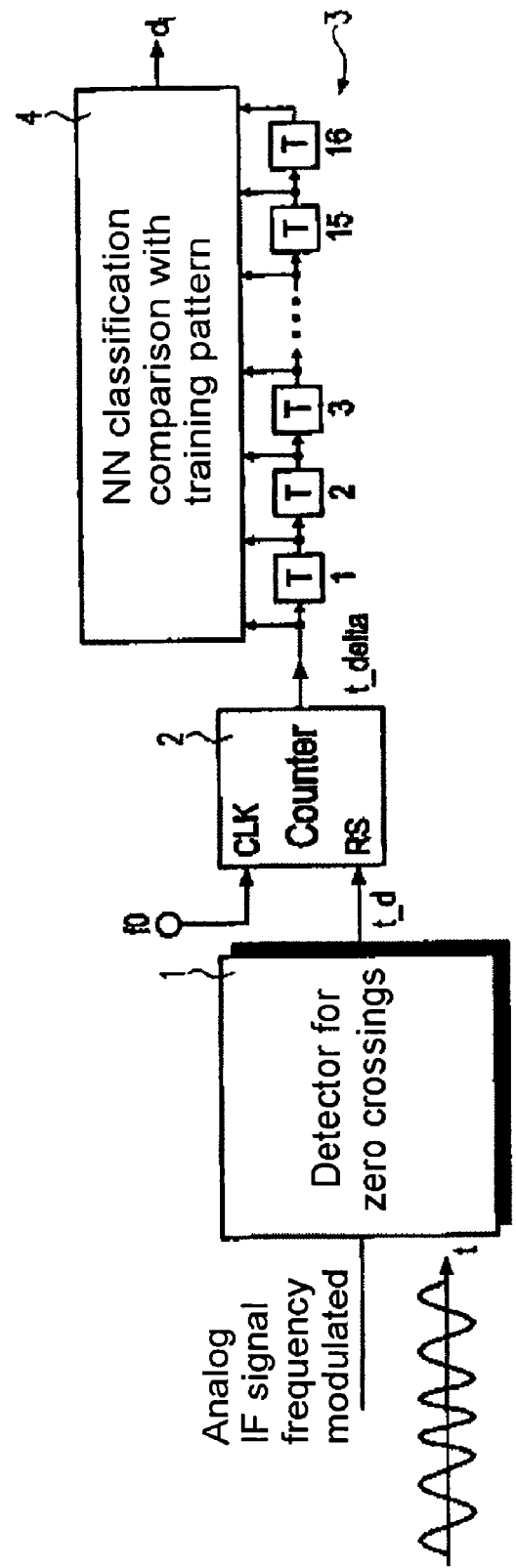
FIG. 2B shows the use of a detector for zero crossings for the demodulation process according to the invention.

FIG. 2B shows one exemplary embodiment of an apparatus according to the invention and of a demodulator or detector. The analog, frequency-modulated intermediate-frequency signal represents the input signal to the zero crossing detector 1. This input signal may, for example, be the output signal from a limiter. The input signal to the zero crossing detector is converted to a signal t_d, which produces a reset pulse for a counter 2 at each zero crossing. The counter 2 counts clock pulses which are supplied to it at a constant frequency $f_0$. Before the counter 2 is reset, the count which has been reached is emitted, and is converted to a signal t_delta, which indicates the time intervals between successive zero crossings. These values t_delta are stored in a shift register chain 3. A specific number of values t_delta can be used for identification of the corresponding bit sequence $d_i$.

As has already been mentioned above, the demodulation method is far more robust to interference if two or more successive zero crossings are used for detection. These may be stored in the shift register chain 3, as is illustrated in FIG. 2B. Particularly when using band-limited frequency modulation such as GMSK (Gaussian Minimum Shift Keying), the influence of one bit, that is to say of a data signal, on the transmission frequency is distributed over a number of bit periods or data signal periods. In a corresponding manner, it is worthwhile using all of the zero crossings in this longer time interval for identification of the associated bit. As an example, a Bluetooth system with a modulation index η of 0.315 may be mentioned, in which one bit influences the transmission frequency over a time interval of 5 bit periods. If the intermediate frequency is 1 MHz, the number of zero crossings in this time interval is about 16. It is thus worthwhile using 16 values for identification of one bit, as is illustrated in FIG. 2B. These 16 zero crossings are, however, determined not only from the bit to be detected, but also from the two preceding bits and the two subsequent bits. It is thus worthwhile determining a bit sequence rather than just one bit from the successive zero crossings. In this specific example, 5 successive bits can be determined from the 16 zero crossings.

The identification is carried out by means of a classification device 4, which determines the distance between the respective interval sequence as determined and stored in the shift register chain 3 and the stored interval sequences which have been stored in a memory, and which are also referred to in the following text as training patterns. The stored interval sequences are obtained from the interval sequences of the zero crossings for all possible bit sequences. Thus, if 5 successive bits are considered, then this results in $2^5=32$ possible bit combinations and thus interval sequences, which must be stored as interval sequences to be stored in the memory. The bit sequence which is associated with a stored interval sequence with the shortest distance from the detected interval sequence with the values t_delta is detected as the output bit sequence $d_i$. If this comparison process is in each case carried out at an interval of one bit period, then five results are produced, overall, for each bit. The classification device 4 then determines the detected bit on the basis of a majority decision. The stored interval sequences may be determined in taking account of systematic errors on the transmission channel, so that these errors can be compensated for.

In order to make the receiver less sensitive to time delays on the radio path, it is possible to additionally carry out the pattern comparison with the stored interval sequences using the adjacent data patterns. For the specific exemplary embodiment in FIG. 2B, this means that the shift register chain 3 is extended to 18 values. The three data patterns in the delay elements 1-15, 2-16 and 3-17 are then used for the comparison. The bit sequence which is associated with the stored interval sequence with the shortest distance from the detected sequence of the values t_delta is once again detected as the output bit sequence $d_i$.

One conventional method for determination of the interval between the data pattern and the training pattern is to calculate the Euclidean interval norm using the following relationship:

$$d(x, y) = \sqrt[g]{\sum_{n=1}^{N} |x_n - y_n|^g}$$

where g=2.

The calculation of the Euclidean interval norm is feasible within the scope of the invention, but is relatively complex, since a series of multiplication operations would have to be carried out. It is far easier to calculate the so-called "city block distance", which is obtained from the above relationship for g=1, and does not require any multiplication operations. Investigations have shown that the use of the city block distance for the described method does not result in any adverse affects on the performance of the demodulation method.

Figure 3:
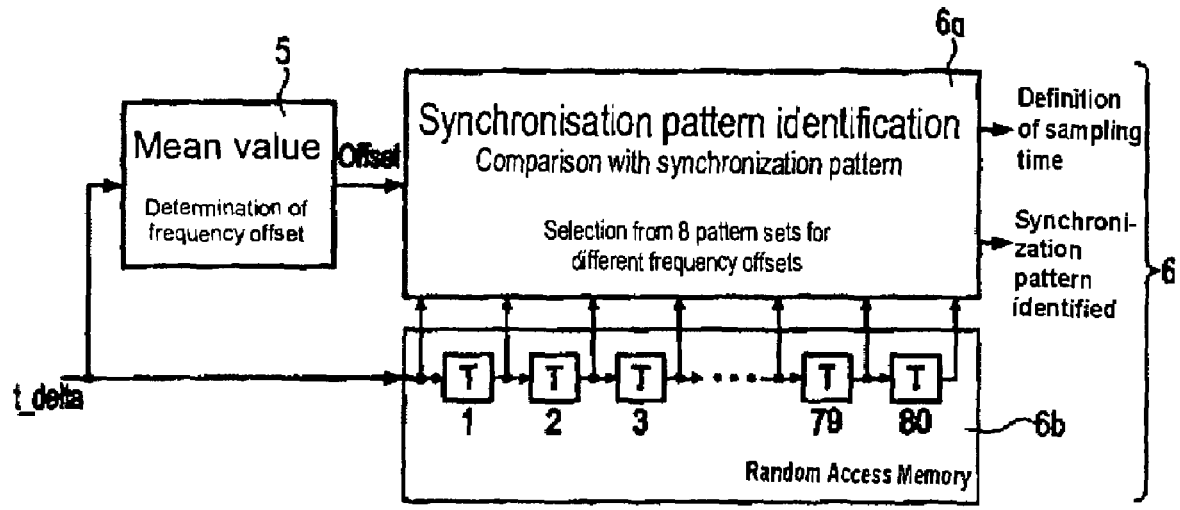
FIG. 3 shows a synchronization unit as part of an apparatus according to the invention.

The apparatus that is illustrated in FIG. 2B may be part of a receiver. If a time-division multiplexing method is used, the receiver has a synchronization unit, in order to synchronize the receiver in time with the time slot structure of the received signal. FIG. 3 shows a block diagram of a synchronization unit such as this. This synchronization unit 6 is connected to a frequency offset identification unit 5. The frequency offset identification unit 5 is a functional block in which a mean value is formed from a number of zero crossing intervals t_delta, and this mean value is compared with an expected and stored mean value. Simulations have shown that the sensitivity of the receiver decreases greatly as the frequency offset becomes greater. It is thus extremely advantageous for frequency offset identification to be carried out even during the synchronization process, so that the synchronization code sequences for classification can be selected on the basis of the determined frequency offset. If a Bluetooth receiver is considered, as one specific exemplary embodiment, with an intermediate frequency of 1 MHz, then it is evident that the influence of the frequency offset on the receiver sensitivity is virtually negligible, provided that the compensation for the frequency offset is carried out in a discrete manner in the following intervals:

−75 kHz, −50 kHz, −25 kHz, 0, 15 kHz, 30 kHz, 45 kHz, 60 kHz, 75 kHz.

A total of eight sets of synchronization code sequences are stored in a comparator device 6a in the synchronization device 6, on the basis of these intervals for the frequency offset. Once the frequency offset identification unit 5 has determined the frequency offset, this frequency offset is transmitted from this unit to the comparator unit 6a, which determines the interval within which the frequency offset is located and, in a corresponding manner, the set of synchronization code sequences which is associated with this interval is selected in the comparator unit 6a. Zero crossing intervals t_delta are stored continuously in a shift register chain in the memory unit 6b and, whenever a further zero crossing interval is entered and the other already stored zero crossing intervals have been shifted appropriately, a comparison is carried out with the synchronization code sequence which was previously selected on the basis of the frequency offset. In the present case, the assumption is made that the synchronization code sequence has 80 zero crossings. As soon as the synchronization code sequence has been positively detected, the synchronization is successfully completed, and the comparator unit 6a defines a sampling time on this basis.

Figure 4:
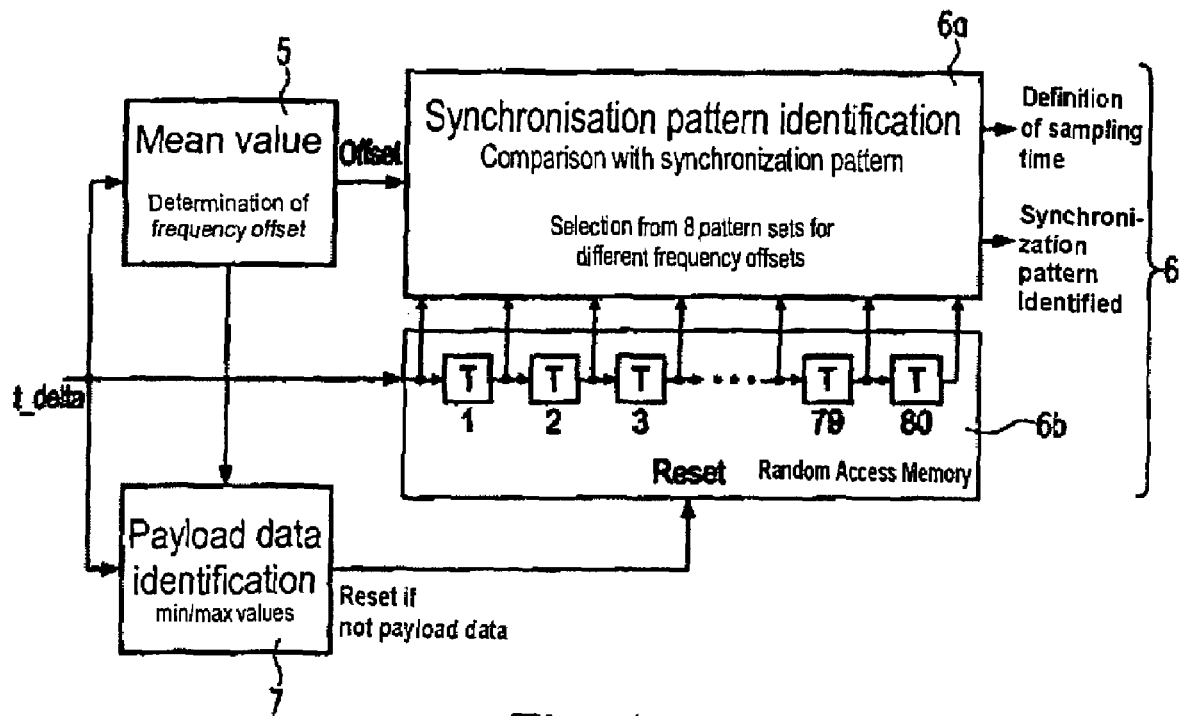
FIG. 4 shows a synchronization unit which interacts with a payload data identification unit, as part of an apparatus according to the invention.

FIG. 4 shows a further embodiment of the apparatus according to the invention as shown in FIG. 3, with the latter apparatus having had a payload data identification unit 7 added to it. The payload data identification unit 7 is supplied with the zero crossing intervals (from the detector 1). In the same way, the mean value of the zero crossing intervals, as determined by the frequency offset identification unit 5, is transmitted to the payload data identification unit 7. This then determines whether the received signal is payload data or an interference signal. In the latter case, the payload data identification unit 7 supplies a reset signal to the memory unit 6a, so that any zero crossing intervals which are already stored in the shift register chain which is contained in the memory unit 6a are reset to zero.

We claim:

1. A method for reception and for processing of a digitally frequency-modulated analog received signal in a cordless communications system, comprising the steps of:

determining zero crossing intervals between the zero crossings of the received signal or of an intermediate-frequency signal that is produced from the received signal, and using the time zero crossing intervals for detection of the digital signal data, wherein any frequency offset which may be present in the received signal is determined before the start of the demodulation process by the steps of:

determining a mean value of a number of determined zero crossing intervals in the received signal, comparing the mean value with an expected mean value of the received signal, and determining the frequency offset from the difference between the mean value and the expected mean value.

2. The method as claimed in claim 1, further comprising:
synchronizing the receiver with a time slot structure of the received signal after
the frequency offset has been determined.

3. The method as claimed in claim 2, wherein
the determined frequency offset is supplied to a comparator unit in which a number, which corresponds to the number of different frequency offsets, of synchronization code sequences which are associated with the frequency offsets are stored, and
one synchronization code sequence is selected on the basis of the supplied frequency offset, and two or more successive zero crossing intervals of the received signal are stored continuously in a memory unit and are compared in the comparator unit with the selected synchronization code sequence, until a match is found between a determined interval sequence and an interval sequence which corresponds to the synchronization code sequence.

\* \* \* \* \*